(12) United States Patent  
Hirai

(10) Patent No.: US 7,326,460 B2
(45) Date of Patent: Feb. 5, 2008

(54) DEVICE, METHOD OF MANUFACTURING THE SAME, ELECTRO-OPTIC DEVICE, AND ELECTRONIC EQUIPMENT

(75) Inventor: Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 562 days.

(21) Appl. No.: 10/807,913

(22) Filed: Mar. 24, 2004

(65) Prior Publication Data

US 2004/0247797 A1    Dec. 9, 2004

(30) Foreign Application Priority Data

Mar. 26, 2003 (JP) .............................. 2003-085539
Feb. 12, 2004 (JP) .............................. 2004-035081

(51) Int. Cl.
*B32B 3/00* (2006.01)
*B32B 7/12* (2006.01)

(52) U.S. Cl. ...................... 428/209; 428/344; 428/345; 313/531

(58) Field of Classification Search ................ 428/209, 428/210, 344–345; 313/531
See application file for complete search history.

(56) References Cited

U.S. PATENT DOCUMENTS

| | | | | | |
|---|---|---|---|---|---|
| 3,879,572 | A | * | 4/1975 | Shoji et al. ................. | 174/257 |
| 4,049,844 | A | * | 9/1977 | Bolon et al. ................. | 427/511 |
| 4,317,750 | A | * | 3/1982 | Provance et al. ............ | 428/210 |
| 4,594,311 | A | * | 6/1986 | Frisch et al. ................ | 430/315 |
| 4,617,253 | A | * | 10/1986 | Taylor et al. ................ | 430/323 |
| 4,668,532 | A | * | 5/1987 | Moisan et al. ................ | 29/852 |
| 4,670,351 | A | * | 6/1987 | Keane et al. ................ | 428/549 |
| 4,853,252 | A | * | 8/1989 | Frankel et al. .............. | 427/596 |
| 4,912,014 | A | * | 3/1990 | Feldman ..................... | 430/202 |
| 5,079,600 | A | * | 1/1992 | Schnur et al. ............... | 257/750 |
| 5,132,248 | A |   | 7/1992 | Drummond et al. | |
| 5,468,597 | A | * | 11/1995 | Calabrese et al. .......... | 430/315 |
| 5,510,216 | A | * | 4/1996 | Calabrese et al. ............ | 430/16 |
| 6,624,071 | B2 | * | 9/2003 | Seki ........................... | 438/681 |
| 6,709,806 | B2 | * | 3/2004 | Hotta et al. ................. | 430/322 |
| 6,800,405 | B2 | * | 10/2004 | Kobayashi .................... | 430/5 |
| 7,070,340 | B2 | * | 7/2006 | Crane et al. ................. | 385/92 |
| 7,189,598 | B2 | * | 3/2007 | Otsuki et al. ............... | 438/119 |

FOREIGN PATENT DOCUMENTS

| | | |
|---|---|---|
| JP | 9-92949 | 4/1997 |
| JP | 9-199816 | 7/1997 |
| JP | 2002-042557 | 2/2002 |
| KR | 2002-0009509 | 2/2002 |
| KR | P2002-0096536 | 12/2002 |

OTHER PUBLICATIONS

Communication from Korean Patent Office regarding related application.
Communication from Chinese Patent Office regarding corresponding application.

* cited by examiner

*Primary Examiner*—Cathy F. Lam
(74) *Attorney, Agent, or Firm*—Harness, Dickey & Pierce, P.L.C.

(57) ABSTRACT

A first conductive film is formed on a wiring pattern area on a plate by dropping liquid drops. A second conductive film which is electrically separated from the first conductive film is formed by discharging liquid drops outside of the wiring pattern area on the plate.

5 Claims, 11 Drawing Sheets

DEVICE, METHOD OF MANUFACTURING THE SAME, ELECTRO-OPTIC DEVICE, AND ELECTRONIC EQUIPMENT

RELATED APPLICATIONS

This application claims priority to Japanese Patent Application Nos. 2003-085539 filed Mar. 26, 2003 and 2004-035081 filed Feb. 12, 2004 which are hereby expressly incorporated by reference herein in their entireties.

BACKGROUND

1. Technical Field

The present invention relates to a device, a method of manufacturing the same, an electro-optic device, and electronic equipment.

2. Background Art

Wiring used for electronic circuits or integrated circuits is manufactured, for example, by a photolithography method. In the photolithography method, the wiring is formed by applying photosensitive material called resist on a plate, on which a conductive film is applied in advance, developing by irradiating a circuit pattern, and etching the conductive film according to a resist pattern. The lithography method requires large scale equipment and complex processes such as a vacuum device, and the material usage efficiency is only several percent. Therefore, most of the material has to be put on the shelf, and hence it requires high manufacturing costs.

Alternatively, there is proposed a wiring pattern forming process using a liquid drop discharging process, which is so-called an inkjet method, in which liquid material is discharged in the form of liquid drops from a liquid drop discharging head (For example, see U.S. Pat. No. 5,132, 248). In this process, ink for a wiring pattern, which is functional liquid containing conductive fine particles such as metal particles disposed therein is applied directly to the plate as a pattern, which is converted into the conductive film pattern by subsequently performing heat treatment or laser irradiation. This process has advantages such that photolithography is no longer necessary, and hence the process is significantly simplified, and at the same time, the amount of material to be used may be reduced.

However, there are problem as shown below.

According to ink application by the inkjet method, it is possible to discharge and apply liquid drops on the order of micrometers in diameter at a high resolution. However, fine liquid applied on the plate dries very quickly and, in addition, it generally starts drying quickly at the ends (upper end, lower end, right end, and left end) of the applied area on the plate since the partial pressure of the solvent molecules (concentration of solvent vapor) vaporized from the fine liquid at these regions is low.

The difference of drying time of the liquid member applied on the plate as described above causes variations in film thickness of conductive film wiring, and variations in film thickness may cause a defect of unevenness of electric property, such as conductivity.

In view of such circumstances, it is an object of the present invention to provide a device, a method of manufacturing the same, an electro-optic device, and electronic equipment, which do not cause variations in film thickness and can solve unevenness of the electric property.

SUMMARY

In order to achieve the above-described object, the present invention employs the following configuration.

A device of the present invention is a device in which a conductive film wiring is disposed on a wiring pattern area on the plate by liquid drop discharge, characterized in that a second conductive film is formed outside the wiring pattern area on the plate by the liquid drop discharge so as to be electrically separated from the conductive film.

Therefore, in the device of the present invention, although drying of the second conductive film, which is a dummy wiring, makes progress at the ends of the plate where drying proceeds quickly, in the wiring pattern area which is actually used for wiring, the concentration of solvent vapor (atmosphere) becomes uniform due to the presence of the second conductive film, whereby the uniformity of drying and baking atmosphere of the conductive film is achieved, and hence a film of a uniform thickness can be obtained. Therefore, in the present invention, unevenness of an electric property, such as conductivity, caused by variations in film thickness can be avoided. The liquid drops to be discharged that can be employed is one containing metallic fine particles.

Preferably, the second conductive film is formed of the same material as the conductive film.

Accordingly, in the present invention, the liquid member can be continuously discharged without substitution, and hence the operation in association with the replacement of the liquid member can be eliminated, whereby the production efficiency can be improved.

Preferably, the second conductive film is formed in substantially the same arrangement conditions as the conductive film and continuously therefrom. For example, by arranging the second conductive film continuously from the conductive film under the same arrangement conditions, such as the array pitch or the width of the wiring, as the conductive film, it is no longer necessary to form a dot pattern (bitmap) for liquid drop discharge individually, whereby improved workability is achieved.

A configuration in which a liquid rejecting portion provided with a hydrophobic property and a liquid preferring portion provided with a hydrophilic property are formed on the plate, and wiring of the conductive film and the second conductive film are formed by discharging the liquid drops on the liquid preferring portion is also preferable.

Accordingly, in the present invention, even when even when part of the discharged liquid drops is dropped on the hydrophobic portion, they are rejected by the hydrophobic property and brought into the hydrophilic portion. Therefore, the wiring can be formed easily.

An electro-optic device of the invention is characterized in that the above-described device is provided.

Accordingly, since a wiring pattern is formed in a uniform thickness in the present invention, a high-quality electro-optic device in which unevenness of the electric property caused by variations in film thickness of the wiring is solved may be obtained.

Electronic equipment of the present invention is characterized in that the above-described electro-optic device is provided.

Accordingly, in the present invention, since the wiring pattern of uniform film thickness can be formed, there is provided a high-quality electronic equipment in which unevenness of the electric property caused by variations in film thickness of the wiring is avoided.

On the other hand, a method of manufacturing the device according to the present invention is the method of manufacturing the device for forming the wiring of the conductive film on the wiring pattern area on the plate by discharging liquid drops including a process of discharging liquid drops outside the wiring pattern area on the plate to form the second conductive film which is electrically separated from the conductive film.

Accordingly, in the present invention, although drying of the second conductive film as a dummy wiring makes progress at the ends of the plate where drying proceeds quickly, in the wiring pattern area which is actually used for wiring, the concentration of solvent vapor (atmosphere) becomes uniform due to the presence of the second conductive film, whereby the uniformity of drying and baking atmosphere of the conductive film is achieved, and hence a film of a uniform thickness can be obtained. Therefore, in the present invention, unevenness of electric property, such as conductivity, caused by variations in film thickness can be solved.

DETAILED DESCRIPTION

Figure 1:
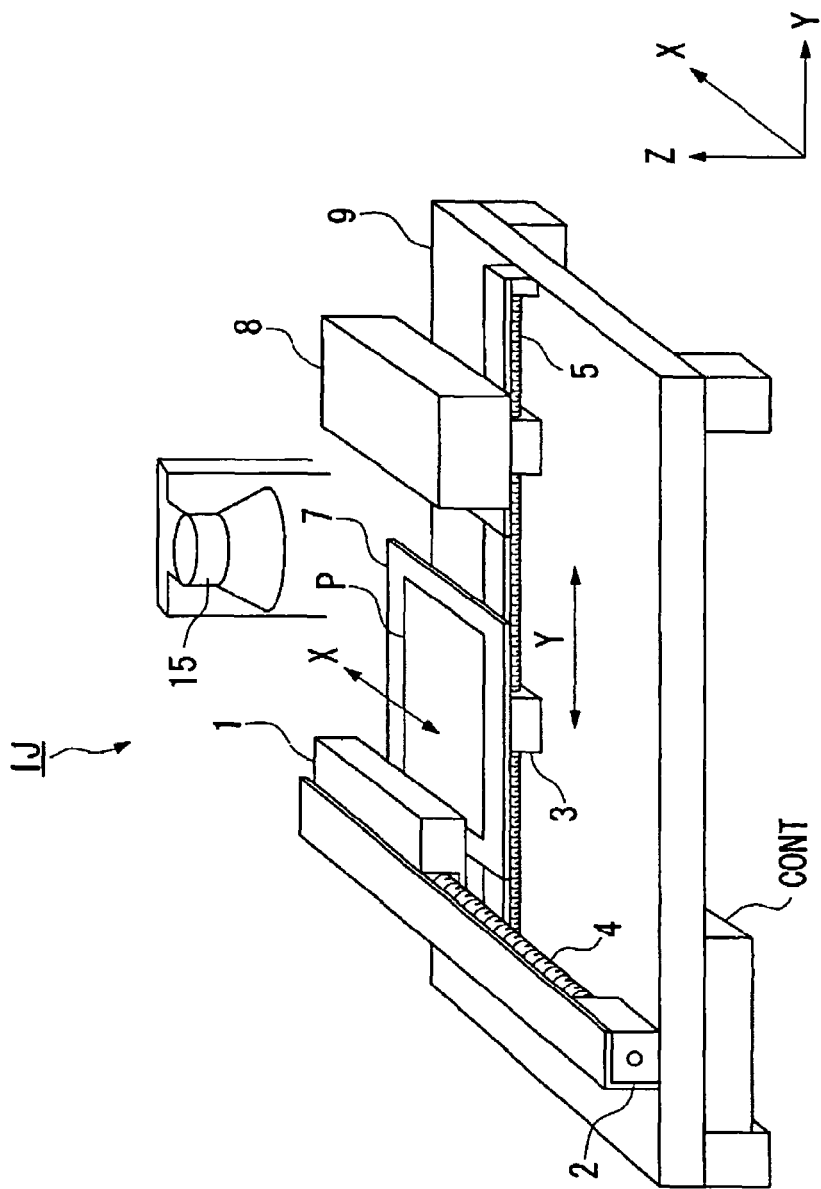
FIG. 1 is a general perspective view of a liquid drop discharging device.

Referring to FIG. 1 to FIG. 12, embodiments of a device, a method of manufacturing the same, an electro-optic device and electronic equipment according to the present invention will be described.

Here, ink for a wiring pattern, which is functional fluid, will be described.

Ink for a wiring pattern discharged in the form of liquid drops from a nozzle of a liquid drop discharging head by a liquid drop discharging process is generally formed of dispersion liquid obtained by dispersing conductive fine particles in a dispersion medium.

In the present embodiment, in addition to metal fine particles containing any one of gold, silver, copper, palladium, and nickel, oxide of the same, conductive polymer, and superconductive fine particles may be employed as the conductive fine particles.

These conductive fine particles may be used by being coated with organic substance on the surface thereof in order to improve its dispersion property. As a coating agent to be coated on the surface of the conductive fine particles includes, for example, organic solvent such as xylene or toluene, and citric acid.

The diameter of the conductive fine particle is preferably between 1 nm and 0.1 μm inclusive. When it is larger than 0.1 μm, there is a risk that a nozzle of a liquid drop discharging head described later is clogged. In contrast, when it is smaller than 1 nm, the volume ratio of the coating agent with respect to the conductive fine particles increases, and hence the percentage of organic substance in the obtained film will be excessive.

The dispersion medium is not specifically limited as long as it can disperse the above-described conductive fine particles without generating cohesion. For example, in addition to water, alcohol such as methanol, ethanol, propanol, and butanol, hydrocarbon chemical compounds such as n-heptane, n-octane, decane, dodecane, tetradecane, toluen, xylene, cymene, durene, indene, dipentene, tetrahydronaphthalene, decahydronaphthalene, and cyclohexylbenzene, ether contained chemical compounds such as Ethylene glycol dimethyl ether, Ethylene glycol diethyl ether, Ethylene glycol methyl ethyl ether, Diethylene glycol dimethyl ether, Diethylene glycol diethyl ether, Diethylene glycol methyl ethyl ether, 1,2-Dimethoxyethane, Bis(2-methoxyethyl) ether, and p-Dioxane, and polar compounds such as Propylene carbonate, γ-Butyrolactone, N-Methyl-2-pyrrolidone, Dimethylformamide, Dimethyl sulfoxide, and Cyclohexanone can be used. Among these media, water, alcohol group, hydrocarbon chemical compounds, ether containing chemical compound are preferable in terms of dispersion property of fine particles, stability of dispersion liquid, and ease of application to the liquid drop discharging process (ink jet method), and as more preferable dispersion medium, water and hydrocarbon chemical compounds are used.

The surface tension of dispersion liquid of conductive fine particles described above is preferably in the range between 0.02 N/m and 0.07 N/m inclusive. In the case where discharging liquid by the inkjet method, if the surface tension is below 0.02 N/m, wettability of the ink compound with respect to the nozzle surface increases, and hence deviation of flying direction is apt to occur. In contrast, if the surface tension exceeds 0.07 N/m, the amount of discharge and timing of discharge is difficult to control since the shape of meniscus at the extremity of the nozzle is not stable. In order to adjust the surface tension, it is recommended to add a slight amount of an agent such as fluorine contained, silicone contained, or nonionic surface tension control agent to the dispersion liquid as long as the contact angle with respect to the plate is not significantly lowered. Nonionic surface tension control agent contributes to improve wettability of liquid with respect to the plate, improve a film leveling property, and prevent generation of fine roughness on the film. The above-described surface tension control agent may include organic chemical compounds such as alcohol, ether, ester, ketone as needed.

The viscosity of the above-described dispersion liquid is preferably between 1 mPa.s and 50 mPa.s inclusive. When discharging liquid material as liquid drops using the inkjet method, if the viscosity is smaller than 1 mPa.s, the portion around the nozzle is apt to be contaminated by ink flowing out therethrough, and when the viscosity is larger than 50 mPa.s, frequency of clogging of the nozzle hole increases, which hinders smooth discharge of liquid drops.

The discharging technology of the liquid drop discharging process includes an electrostatic control system, a pressure and vibration applying system, an electric-mechanic conversion system, an electric-thermal conversion system, and an electrostatic aspiration system. The electrostatic control system is a process of applying electric charge to the material via a charged electrode, and controlling the flying direction of material by a polarized electrode to allow the material to be discharged from the nozzle. The pressure and vibration applying system is a process of applying a super-high pressure about 30 kg/cm2 to the material to allow the extremity of the nozzle to discharge the material. In this system, when the control voltage is not applied the material is injected from the nozzle in a straight manner, and when the control voltage is applied, electrostatic repulsion occurs in the material so that the material is dispersed and hence is not discharged from the nozzle. The electric-mechanic conversion system utilizes a property of piezoelectric device which is deformed upon reception of pulsated electric signal, in which a pressure is applied to a space where the material is stored via a flexible substance by deformation of piezoelectric device and hence the material is pushed out from the space and discharged from the nozzle.

The electric-thermal conversion system is a process of vaporizing the material rapidly by a heater provided in the space in which the material is stored to generate bubbles, and allows the material in the space to be discharged by the pressure of the bubbles. The electrostatic aspiration system is a process of applying a slight pressure in the space in which the material is stored to form a meniscus of material at the nozzle, and in this state, applying electrostatic attraction to draw out the material. There are also other applicable technologies such as a system of utilizing a variation of the viscosity of fluid due to the electric field, or a system of injecting by jump spark. The liquid drop discharging process has advantages in that waste of material is small and a desired amount of material can be disposed at desired positions accurately. The amount of one drop of liquid-state material (fluid) to be discharged in the liquid drop discharging process is, for example, 1 to 300 nanograms.

Subsequently, a device manufacturing apparatus used for manufacturing the device according to the present invention will be described.

The device manufacturing apparatus is a liquid drop discharging device (inkjet device) for manufacturing the device by discharging (dropping) liquid drops from the liquid drop discharging head onto the plate.

FIG. 1 is a perspective view showing a general construction of a liquid drop discharging device IJ.

The liquid drop discharging device IJ includes a liquid drop discharging head 1, an X-axis direction driving shaft 4, a Y-axis direction guiding shaft 5, a control unit CONT, a stage 7, a cleaning mechanism 8, a base table 9, and a heater 15.

The stage 7 is for supporting a plate P on which ink (liquid material) is supplied from the liquid drop discharging device IJ, and is provided with a securing mechanism, not shown, for securing the plate P at a reference position.

The liquid drop discharging head 1 is a liquid drop discharging head of multi-nozzle type having a plurality of discharging nozzle, and the longitudinal direction thereof is aligned with the Y-axis direction. The plurality of discharging nozzles are arranged in the Y-axis direction on the lower surface of the liquid drop discharging head 1 at regular intervals. Ink containing the above-described conductive fine particles is discharged from the discharging nozzle of the liquid drop discharging head 1 onto the plate P supported on the stage 7.

An X-axis direction driving motor 2 is connected to the X-axis direction driving shaft 4. The X-axis direction driving motor 2 is a stepping motor or the like and rotates the X-axis direction driving shaft 4 when a driving signal in the X-axis direction is supplied from the control unit CONT. When the X-axis direction driving shaft 4 rotates, the liquid drop discharging head 1 moves in the X-axis direction.

The Y-axis direction guiding shaft 5 is secured to the base table 9 so as not to move. The stage 7 is provided with a Y-axis direction driving motor 3. The Y-axis direction driving motor 3 is a stepping motor or the like, and moves the state 7 in the Y-axis direction when a driving signal in the Y-axis direction is supplied from the control unit CONT.

The control unit CONT supplies a voltage for controlling discharge of liquid drop to the liquid drop discharging head 1. It also supplies a driving pulse signal for controlling the movement of the liquid drop discharging head 1 in the X-axis direction to the X-axis direction driving motor 2, and supplies a driving pulse signal for controlling the movement of the stage 7 in the Y-axis direction to the Y-axis direction driving motor 3.

The cleaning mechanism 8 is for cleaning the liquid drop discharging head 1. The cleaning mechanism 8 is provided with a Y-axis direction driving motor, not shown. The cleaning mechanism moves along the Y-axis direction guiding shaft 5 by driving the Y-axis direction driving motor. The movement of the cleaning mechanism 8 is also controlled by the control unit CONT.

The heater 15 is means for providing heat treatment to the plate P by lamp annealing, and evaporates and dries the solvent contained in the liquid material applied on the plate P. Turning ON and OFF of the power source of the heater 15 is also controlled by the control unit CONT.

The liquid drop discharging device IJ discharges liquid drops on the plate P, while relatively scanning the liquid drop discharging head 1 and the stage 7 for supporting the plate P. In the following description, the X-axis direction is referred to as a scanning direction, and the Y-axis direction which is orthogonal to the X-axis direction is referred to as a non-scanning direction. Accordingly, the discharging nozzles of the liquid drop discharging head 1 are arranged in the Y-axis direction, which is the non-scanning direction, at regular intervals. While the liquid drop discharging head 1 is oriented at a right angle with respect to the direction of travel of the plate P in FIG. 1, it is also possible to adjust the angle of the liquid drop discharging head 1 to make it intersect with the direction of travel of the plate P.

In this arrangement, by adjusting the angle of the liquid drop discharging head 1, the pitches among the nozzles can be adjusted. It is also possible to configure in such a manner that the distance between the plate P and the nozzle surface can be adjusted as desired.

Figure 2:
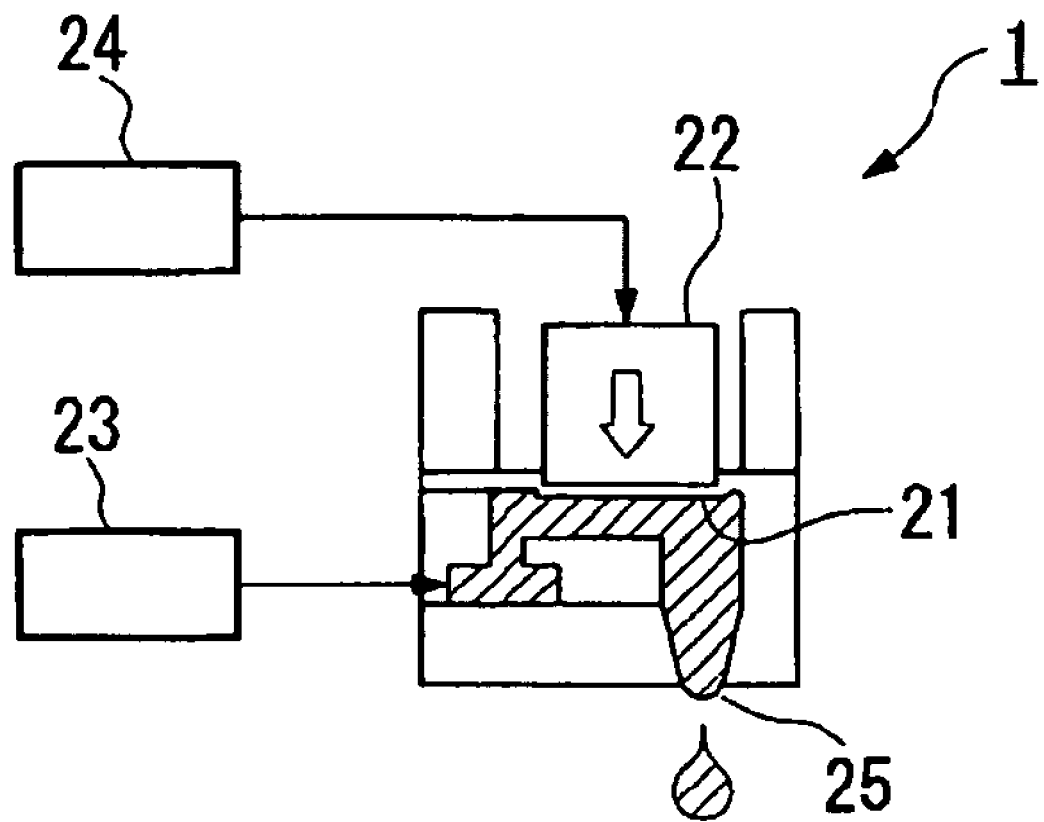
FIG. 2 is an explanatory drawing showing the principle of discharge of liquid member by a piezo-system.

FIG. 2 is an explanatory drawing showing a discharging principle of the liquid material by piezoelectric system.

In FIG. 2, the piezoelectric device 22 is disposed adjacent to a liquid chamber 21 for storing the liquid material (ink for wiring patter, functional fluid). The liquid chamber 21 receives a supply of liquid material via a liquid material feed system 23 including a material tank for storing the liquid material. The piezoelectric device 22 is connected to a driving circuit 24, and when a voltage is applied to the piezoelectric device 22 via the driving circuit 24, the piezoelectric device 22 is deformed, and hence the liquid chamber 21 is deformed, whereby the liquid material is discharged from nozzles 25. In this case, by changing the value of applied voltage, the amount of deformation of the piezoelectric device 22 is controlled. Also, by changing the frequency of applied voltage, the speed of deformation of the piezoelectric device 22 is controlled. Liquid drop discharge according to the piezoelectric system has an advantage in that constitution of the material is hardly affected because no heat is applied to the material.

Subsequently, a plasma-type display device will be described as an electro-optic device for forming the wiring pattern by the above-described liquid drop discharging device IJ.

Figure 3:
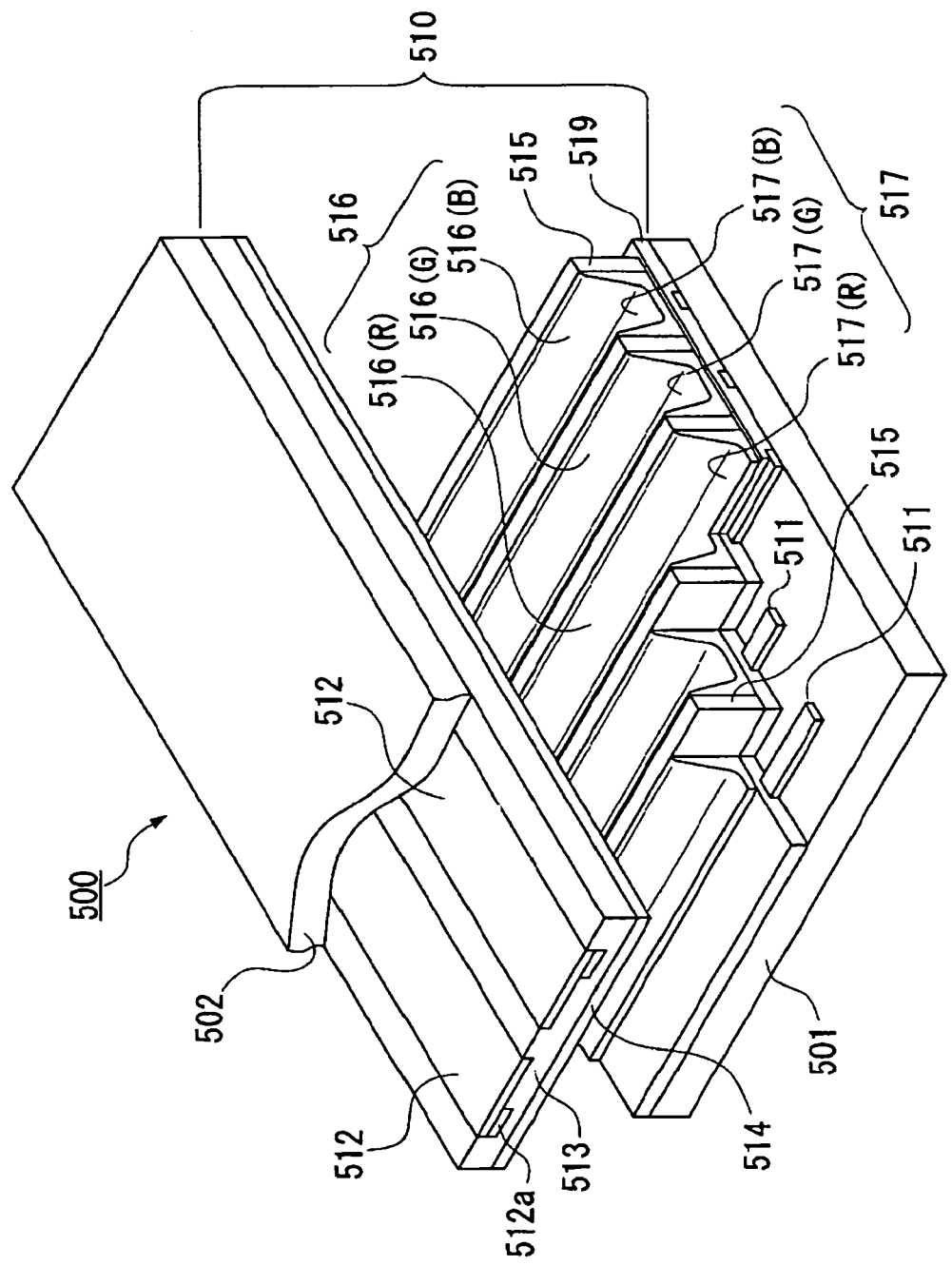
FIG. 3 is an exploded perspective view of a plasma-type display device.

FIG. 3 shows an exploded perspective view of a plasma-type display device 500 of the present embodiment.

The plasma-type display device (electro-optic device) 500 includes a glass plate 501 and a glass plate 502 opposed to each other, and a discharge display unit 510 formed between these glass plates.

The discharge display unit 510 includes a plurality of aggregated discharge chambers 516, and out of the plurality of discharge chambers 516, three discharge chambers 516; a red discharge chamber 516 (R), a green discharge chamber 516 (G), and a blue discharge chamber 516 (B); forms a pair and constitutes one pixel.

Address electrodes 511 are formed into stripes on the upper surface of the plate 501 at predetermined intervals, and a dielectric layer 519 is formed so as to cover the address electrode 511 and the upper surface of the plate 501.

Partition walls 515 are formed on the dielectric layer 519 between the address electrodes 511, 511 so as to extend along the respective address electrodes 511. The partition walls 515 include partition walls adjacent to the address electrodes 511 on both left and right sides in the widthwise direction and partition walls extending in the direction orthogonal to the address electrodes 511. Discharge chambers 516 are formed so as to correspond to these rectangular areas partitioned by the partition walls 515.

Disposed within the rectangular areas partitioned by the partition walls 515 are fluorescent materials 517. The fluorescent materials 517 emit fluorescent light of any one of red, green, or blue. A red fluorescent material 517 (R) is disposed on the bottom of the red discharge chamber 516 (R), a green fluorescent material 517(G) is disposed on the bottom of the green discharge chamber 516(G), and a blue fluorescent material 517 (B) is disposed on the bottom of the blue discharge chamber 516(B), respectively.

On the other hand, on the plate 502, there are provided a plurality of display electrodes 512 in the direction orthogonal to the aforementioned address electrodes 511 in stripes of predetermined intervals. In addition, a dielectric layer 513 is formed so as to cover the display electrodes 512, and a protective film 514, for example, of MgO is formed thereon.

The plate 501 and the plate 502 are bonded with each other with the address electrodes 511 . . . and the display electrodes 512 . . . orthogonally opposed.

The address electrodes 511 and the display electrode 512 described above are connected to an AC power source, not shown. The fluorescent materials 517 in the discharge display unit 510 are excited by distributing electricity to the respective electrodes, and thus emit light to achieve a color display.

In the present embodiment, the above-described address electrode 511 is formed on the plate 501 (corresponding to the plate P in FIG. 1) by the above-described liquid drop discharging device IJ, and the display electrode 512 is formed on the plate 502 (corresponding to the plate P in FIG. 1) using a method of manufacturing the device, respectively.

Subsequently, a process of forming a conductive film wiring such as electrodes on the plate in the plasma-type display device will be described as an example of an embodiment of the device manufacturing process according to the present invention. The wiring forming process according to the present embodiment is for disposing ink for a conductive film wiring on the plate, and forming a conductive film pattern (conductive film) for wiring on the plate, and includes a process of surface treatment, a material arranging process, and a process of heat treatment/optical treatment.

In this example, ink for a wiring pattern according to the present invention described above is used as ink for conductive film wiring. The liquid drop discharging device IJ is used for arranging ink, and the liquid drop discharging process, that is, so-called inkjet method in which ink is discharged as liquid drops via nozzles 25 of the liquid drop discharging head 1 is used. In addition to the piezoelectric system, the discharging system of the liquid drop discharging device may be a system of discharging liquid material by rapid generation of vapor by heat application.

The plate on which conductive film wiring is to be formed may be of various types of material, such as glass, quartz glass, Si wafer, plastic film, or metal plate. In addition, the above-described materials formed with semiconductor film, metal film, dielectric film, or organic film on the surface thereof as a foundation layer are also included.

Process of Surface Treatment

The process of surface treatment is roughly includes a process of providing a hydrophobic property for providing the hydrophobic property to the surface of the plate, and a process of providing a hydrophilic property for providing a hydrophilic property to the surface of the plate provided with a hydrophobic property.

In the process of providing a hydrophobic property, the surface of the plate on which the conductive film wiring is to be formed is provided with a hydrophobic property with respect to the liquid material. More specifically, surface treatment is performed on the plate so as to obtain a predetermined contact angle of 60 [deg.] or larger, more preferably, between 90 [deg.] and 110 [deg.] inclusive with respect to the liquid material containing the conductive fine particles.

As a process of controlling the hydrophobic property (wettability) of the surface, for example, a process of forming a self-organized film on the surface of the plate, or a plasma treatment process can be employed.

In the process of forming the self-organized film, a self-organized film, for example, of organic molecular film, is formed on the surface of the plate on which the conductive wiring is to be formed.

The organic molecular film for treating the surface of the plate includes a functional group which can be bonded to the plate at one end, a functional group for converting the property of the surface of the plate to a hydrophilic group or a hydrophobic group (controlling surface energy) at the other end, and a carbon straight chain or a partly branched carbon chain for connecting these functional groups, and is bonded to the plate and self-organized to form a molecular film, such as a unimolecular film.

The self-organized film includes a bonding function group capable of reacting to a foundation layer constituting atoms of the plate and other straight molecules and is formed by orienting a chemical compound having an extremely high orientation by virtue of mutual action of the straight molecules. Since the self-organized film is formed by orienting monomolecules, the film thickness can be reduced extremely. In addition, a uniform film in a molecular level is obtained. That is, since the same molecule is placed on the surface of the film, a uniform and superior hydrophobic property or hydrophilic property may be provided to the surface of the film.

For example, when fluoroalkylsilane is employed as the chemical compound having a high orientation, each chemical compound is oriented so that the fluoroalkyl group is positioned on the surface of the film, and the self-organized film is formed. Therefore, a uniform hydrophobic property is provided on the surface of the film.

The chemical compounds which form such the self-organized film may be fluoroalkylsilane (hereinafter referred to as "FAS") such as Heptadecafluoro-1,1,2,2-tetrahydrodecyltriethoxysilane, Heptadecafluoro-1,1,2,2-tetrahydrodecyltrimethoxysilane, Heptadecafluoro-1,1,2,2-tetrahydrodecyltrichlorosilane, Tridecafluoro-1,1,2,2-tetrahydrooctyltriethoxysilane, Tridecafluoro-1,1,2,2-tetrahydrooctyltrimethoxysilane, Tridecafluoro-1,1,2,2-tetrahydrooctyltrichlorosilane, and Trifluoropropyltrimethoxysilane. These chemical compounds may be used independently, or by combining two or more types. By using FAS, adhesiveness with respect to the plate and a desirable hydrophobic property are obtained.

The FAS is generally represented by a constitutional formula $RnSiX_{(4-n)}$. Here, the sign n represents an integer between 1 and 3 inclusive, and X represents hydrolysable group such as methoxy group, ethoxy group, and halogen atom. The sign R represents fluoroalkyl group, having a constitution of $(CF_3)(CF_2)x(CH_2)y$ (where the sign x represents an integer between 0 and 10 inclusive, and the sign y represents an integer between 0 and 4 inclusive), and when a plurality of R1 or Xs are bonded to Si, all the Rs or Xs may be the same, or may be different. The hydrolysable group represented by X forms silanol by hydrolysis, responds to hydroxyl group of the backing such as plate (glass, silicon) and bonded to the plate by siloxane bond. On the other hand, since R has a fluoro group such as $(CF_2)$ on the surface, it modifies the base surface such as the plate into a surface that does not get wet (low in surface energy).

The self-organized film formed of organic molecular film or the like is formed on the plate by placing the above-described material chemical compounds and the plate in the same sealed container, and, at room temperature, leaving it to stand for about two or three days. Alternatively, by keeping the sealed container at a temperature of 100° C., it is formed in about three hours on the plate. While the process described above is a process of forming the self-organized film from the gas phase, it can also be formed from a liquid phase as well. For example, the self-organized film can be formed on the plate by immersing the plate in a solution containing the material chemical compound and then cleaning and drying the same.

It is preferable to perform surface preparation by irradiating ultraviolet light onto the surface of the plate or by cleaning by solvent before forming the self-organized film.

On the other hand, in the plasma treatment process, plasma is irradiated to the plate at atmospheric pressure or in vacuum. The type of gas used for plasma treatment can be variously selected considering the quality of material of the plate surface on which the conductive wiring is to be formed. For example, tetrafluoromethane, perfluorohexane, or perfluorodecane can be used as treatment gas.

The treatment for providing a hydrophobic property to the surface of the plate may also performed by adhering a film having a desired hydrophobic property, such as polyimide film applied with tetrafluoromethane, on the surface of the plate. Alternatively, the polyimide film having high hydrophobic property may be used as the plate as it is.

When the surface of the plate has a higher hydrophobic property than the desired hydrophobic property to the surface of the plate, the wettability of the surface of the plate may be controlled by providing a hydrophilic property to the surface of the plate by irradiating ultraviolet light of 170-400 nm or by exposing the plate to an ozone atmosphere. The process of providing a hydrophilic property will be described in detail below.

In the process of providing a hydrophilic property, since the surface of the plate immediately after the process of providing the hydrophobic property normally has a higher hydrophobic property than the desired hydrophobic property, the hydrophobic property is alleviated by the treatment of providing hydrophilic property.

As the process of providing hydrophilic property, there is a process of irradiating ultraviolet light of 170-400 nm. Accordingly, a hydrophobic film once formed can be destructed partly, but uniformly as a whole to alleviate the hydrophobic property.

In addition, it is also possible to provide the hydrophilic property only to the portion of a wiring by irradiating ultraviolet light using a mask having a shape corresponding to the wiring pattern. In this case, since the hydrophobic portion and the hydrophilic portion of the surface of the plate are clearly zoned, even when part of the discharged liquid drops is dropped on the hydrophobic portion, they are rejected by the hydrophobic property and brought into the hydrophilic portion. Therefore, the wiring can be formed easily.

While the extent of alleviation of the hydrophobic property can be adjusted by irradiation time of ultraviolet light, it can also be adjusted by the combination of the intensity and wavelength of ultraviolet light, and heat treatment (heating).

As another process of providing hydrophilic property, there is a plasma treatment using oxygen as a reactive gas. With this process, the film having the hydrophobic property once formed can be transformed partly, but uniformly as a whole to alleviate the hydrophobic property.

Another process of treatment of providing the hydrophilic property is a treatment of exposing the plate to the ozone atmosphere.

With this process, the film having the hydrophobic property once formed can be transformed partly, but uniformly as a whole to alleviate the hydrophobic property.

In this case, the extent of alleviation of the hydrophobic property can be adjusted by the output, distance, and time period of irradiation.

Process of Material Arrangement

Figure 4:
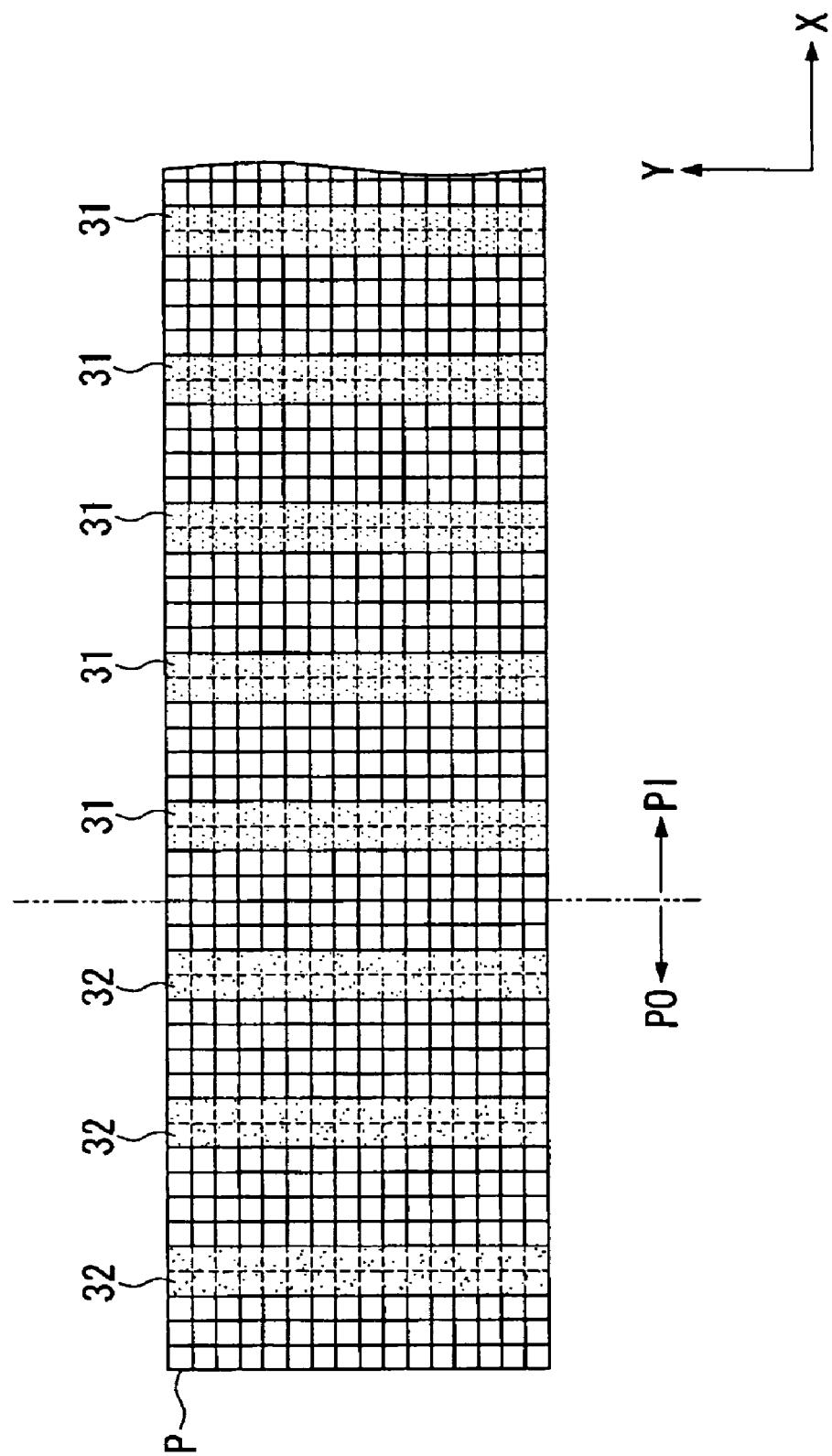
FIG. 4 is an enlarged schematic diagram showing part of wiring of the plasma-type display device.
Figure 5:
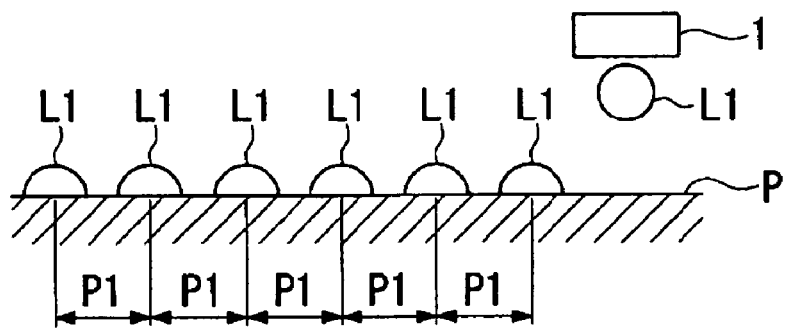
FIGS. 5A-C are drawings showing a process of arranging ink on a plate.
Figure 5:
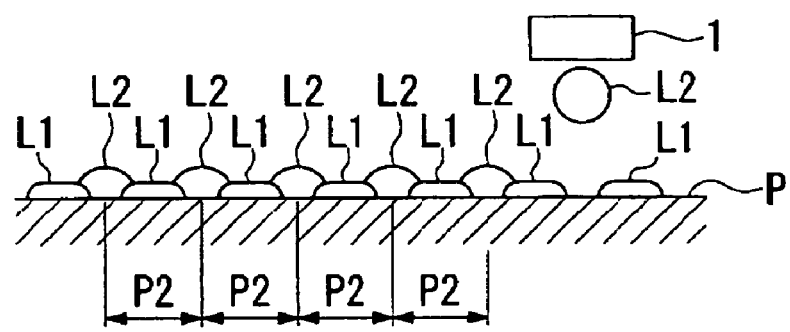
Figure 5:
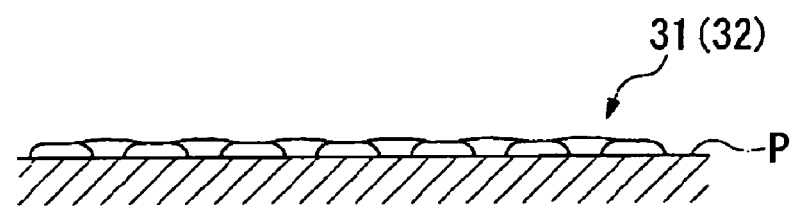

FIG. 4 is an enlarged schematic drawing showing part (for example, the address electrode) of the wiring of the plasma-type display device shown in FIG. 3. In the schematic drawing shown in FIG. 4, an electrode pattern (conductive film) 31 (for example, it corresponds to the address electrode 511 in FIG. 3) and a dummy pattern (second conductive film) 32 are formed on the plate P in a linear shape extending in the Y-axis direction, respectively. The electrode pattern 31 is disposed in a wiring pattern area PI on the plate P in which a fluorescent material 517 is disposed, and the dummy pattern 32 is disposed in a dummy area PO outside (around) the wiring pattern area PI electrically separated from the electrode pattern 31.

The electrode pattern 31 formed here has a line width of 120 μm, a line space of 240 μm, and an array pitch of 360 μm. The dummy pattern 32 is formed of the same material as the electrode pattern 31 under the same arrangement conditions of the electrode pattern 31 (line width of 120 μm, line space of 240 μm, array pitch of 360 μm) so as to continue therefrom. The line space with respect to the electrode pattern 31 being adjacent at the boundary between the wiring pattern area PI and the dummy area PO is also 240 μm.

The control unit CONT of the liquid drop discharging device IJ sets a bitmap including a plurality of gridiron bits (unit gratings) on the plate P as shown in FIG. 4, and performing the liquid drop discharging operation for predetermined bits (bits forming the electrode pattern 31 and the dummy pattern 32) out of the plurality of bits of the bitmap while scanning the plate P in the X-axis direction based on the bitmap preset on the plate P to form the electrode pattern 31 and the dummy pattern 32 on the plate P continuously in the same process.

FIGS. 5(a) to (c) show an example of mapping of ink on the plate.

In this process, liquid material is discharged from the liquid drop discharging head 1 in liquid drops and the discharged liquid drops are arranged at constant intervals (pitches) on the plate 1.

As shown in FIG. 5(a), liquid drops L1 discharged from the liquid drop discharging head 1 are arranged in sequence on the plate P at regular intervals. In this example, an arrangement pitch P1 of the liquid drops L1 is determined so as to be larger than the diameter of the liquid drop L1 immediately after having arranged on the plate P. Accordingly, the liquid drops L1 immediately having arranged on the plate P do not come in contact with each other, and hence the spreading of the liquid drops L1 on the plate P by being joined together is prevented. The arrangement pitch P1 of the liquid drops L1 is determined to be two times the diameter of the liquid drop L1 immediately having arranged on the plate P.

Subsequently, as shown in FIG. 5(b), the operation of arrangement of the liquid drops described above is repeated. In other words, as the step shown in FIG. 5(a), liquid material is discharged from the liquid drop discharging head 1 in the form of liquid drops L2, and the liquid drops L2 are arranged on the plate P at regular intervals.

At this time, the volume of the liquid drop L2 (the amount of liquid material for one liquid drop) and an arrangement pitch P2 are the same as those of the liquid drop L1 in the previous step. The positions of the liquid drops L2 is shifted by ½ pitch from the previous liquid drops L1 so that the liquid drops L2 are arranged at intermediate positions between the adjacent previous liquid drops L1 arranged on the plate P.

As described above, the arrangement pitch P1 of the liquid drops L1 on the plate P is larger than the diameter of the liquid drop L1 immediately after having arranged on the plate P, and is less than two times the diameter thereof. Therefore, when the liquid drops L2 are disposed at the intermediate positions between the adjacent liquid drops L1, the liquid drops L2 overlap partly with the liquid drops L1, and hence the spaces between the adjacent liquid drops L1 are filled.

By repeating a series of liquid drop arrangement operations plurality of times, the spaces between the adjacent liquid drops disposed on the plate P are filled and, as shown in FIG. 5(c), the continuous linear electrode pattern 31 (or the dummy pattern 32) is formed on the plate P. In this case, by increasing the number of repetitions of the liquid drop arrangement operations, the liquid drops are overlapped on the plate P in sequence, and hence the film thickness of the electrode pattern 31 (or the dummy pattern 32), that is, the height from the surface of the plate P (thickness) increases. The height (thickness) of the electrode pattern 31 (or the dummy pattern 32) is determined according to the desired film thickness required for the final film pattern, and the number of times of repetition of the liquid drop arrangement operation is determined correspondingly.

The liquid drop discharging conditions, in particular, the volume of the liquid drop and the arrangement pitches of the liquid drops are determined so that the preferable conditions with less roughness is achieved on the shape of the edge of the electrode pattern 31 (or the dummy pattern 32) formed on the plate P. Since the surface of the plate P is provided with the hydrophobic property in advance, spreading of the liquid drops arranged on the plate P is controlled. Therefore, the shape of the edge of the electrode pattern 31 (or the dummy pattern 32) can reliably be controlled to the above-described preferable state, and increase in film thickness can also be achieved easily.

Process of Heat Treatment/Optical Treatment

In the process of heat treatment/optical treatment, the dispersion medium contained in the liquid drops arranged on the plate or the coating agent is removed. That is, it is necessary to remove the dispersion medium completely by baking the liquid material for forming the conductive film arranged on the plate for improving their electric contact between the fine particles.

In addition, when the coating agent such as an organic substance is coated on the surface of the conductive fine particles in order to improve its dispersion property, this coating agent has to be removed.

Normally, the heat treatment and/or the optical treatment are performed in ambient atmosphere. However, it can be performed in an inactive gas atmosphere, such as nitrogen, argon, and helium as needed. The treatment temperature for the heat treatment and/or the optical treatment is selected as needed considering the boiling point (steam pressure) of the dispersion medium, the type or the pressure of atmospheric gas, thermal behavior of the fine particles, such as the dispersion property or the oxidizing property, the presence or the amount of coating agent, or the heat-resistant temperature of the base material.

For example, in order to remove the coating agent formed of an organic substance, it is necessary to bake at about 300° C. When the plate of plastic, for example, is used, it is preferable to perform at a temperature between the room temperature and 100° C. inclusive.

The heat treatment and/or the optical treatment can be performed by, for example, a hot plate or an electric furnace as in the normal process, and also by lamp annealing. Although the light source used for lamp annealing is not specifically limited, an infrared lamp, a xenon lamp, a YAG laser, an argon laser, a carbon dioxide laser, and an eximer laser such as XeF, XeCI, XeBr, KrF, KrCI, ArF, or ArCI may be used as a light source. Though the light source generally used here is one having the output between 10 W and 5000 W inclusive, the output between 100 W and 1000 W is sufficient in the present embodiment.

With the process of heat treatment and/or optical treatment, electric contact between the fine particles is ensured, and hence the electrode pattern 31 and the dummy pattern 32 are converted into the conductive film.

Figure 6:
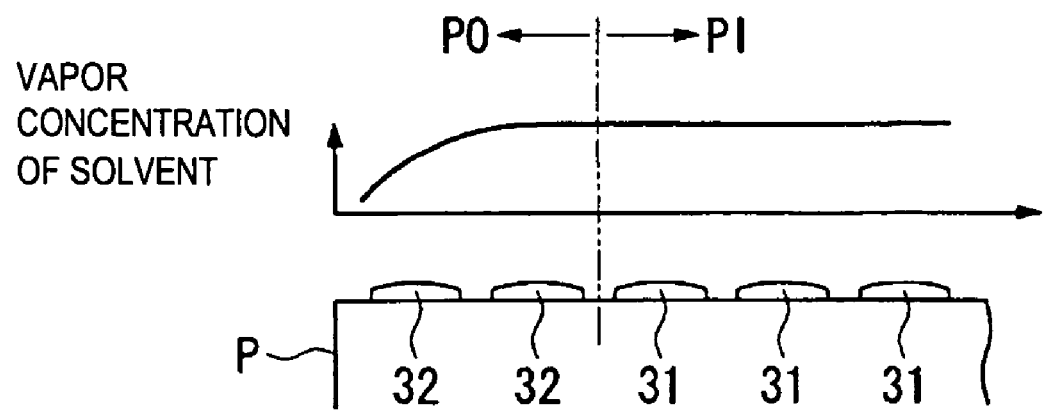
FIG. 6 is a drawing showing the relation between the position of the pattern and the vapor pressure concentration of solvent.

The relation between the position of the pattern on the plate at the time of heat treatment and the vapor pressure concentration of the solvent is shown in FIG. 6.

As shown in the drawing, while the vapor concentration of the solvent evaporated from the pattern (liquid member) is low, and hence drying advances quickly at the end of the plate on which the dummy pattern 32 is disposed, the vapor concentration of the solvent is constant at a value higher than the outside on the inner side of the plate on which the electrode pattern 31 is arranged due to the presence of the dummy pattern 32. Therefore, the area having a risk that the baked state (removal of dispersion medium, uniform removal of coating agent) becomes defective is the dummy area PO outside the wiring pattern area PI, and the electrode pattern 31 disposed in the area used for display will be preferably baked.

With a series of processes described above, a linear conductive film pattern (conductive film wiring) is formed on the plate.

Figure 7:
FIGS. 7A-B are drawings showing a pattern of overlapped application.

As described thus far, according to the present embodiment, since the dummy pattern 32 is disposed outside the wiring pattern area PI by discharging liquid drops, even when unevenness of distribution of the vapor concentration of solvent occurs when drying and baking, a preferable baked state can be easily obtained in terms of the electrode pattern 31, whereby variations in film thickness can be controlled. Therefore, variations in line width or film thickness of the overlapped conductive film patterns due to unevenness of the dried state as in the related art shown in FIG. 7(*a*) can be prevented, and overlapped pattern formation without variations in line width or film thickness as shown in FIG. 7(*b*) is obtained. Therefore, unevenness of the electric property such as conductivity due to variations in film thickness can be prevented, and hence a high-quality device can be manufactured.

In addition, according to the present embodiment, since the electrode pattern 31 and the dummy pattern 32 are formed of the same material, both patterns 31, 32 can be formed in the same discharging step (process of material arrangement), time required for changing the liquid body can be reduced and hence production efficiency can be improved. Furthermore, according to the present embodiment, since the electrode pattern 31 and the dummy pattern 32 are arranged under the same arrangement conditions, and the liquid drops are discharged continuously, it is not necessary to prepare a bitmap (dot pattern) for liquid drop discharge individually, and hence time required for preparing the bitmap can also be reduced.

In the present embodiment, since the liquid drops are discharged on the hydrophilic portion, even when part of the discharged liquid drops are dropped on the hydrophobic portion, it is rejected by the hydrophobic property and hence is placed on the hydrophilic portion, whereby an effect that the wiring can easily be formed is also achieved. Furthermore, since a quality inspection for the electrode pattern 31 such as a conductive test or adhesive test, including inspection of resistance, can be conducted on the dummy pattern 32, the electrode pattern 31 is prevented from becoming damaged. Moreover, because the dummy pattern 32 is arranged at the end the dummy pattern 32 is advantageously more accessible for conducting a test in comparison with the electrode pattern 31.

The electrode pattern 31 in the embodiment described above may be applied to both the address electrode 511 and the display electrode 512 in the plasma-type display device shown in FIG. 3.

Subsequently, as another example of the electro-optic device of the present invention, a liquid crystal display device will be described.

Figure 8:
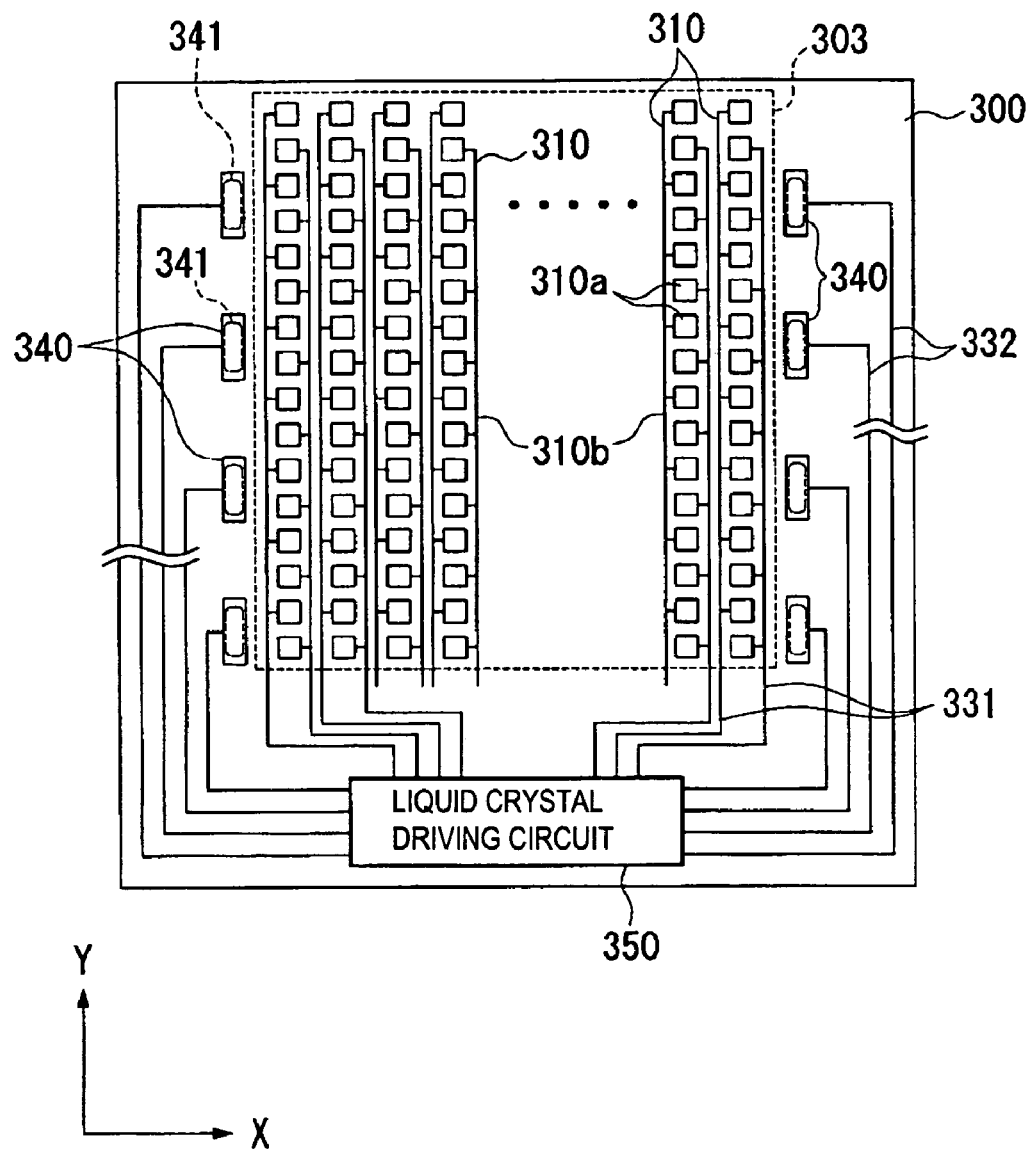
FIG. 8 is a drawing showing a plan layout on a first plate of a liquid crystal display device.

FIG. 8 shows a plan layout of signal electrode on a first plate of the liquid crystal display device according to the present embodiment. The liquid crystal display device according to the present embodiment generally includes the first plate, a second plate (not shown) provided with a scanning electrode and so on, and liquid crystal (not shown) encapsulated between the first plate and the second plate.

As shown in FIG. 8, a plurality of signal electrodes 310 . . . are provided in a multiple matrix manner on a pixel area 303 on a first plate 300. In particular, each signal electrode 310 . . . includes a plurality of pixel electrode portions 310*a* . . . provided corresponding to each pixel, and signal wiring portion 310*b* . . . for connecting them in a multiple matrix manner, and extends in the Y-direction.

Reference numeral 350 designates a liquid crystal driving circuit including a single chip, and the liquid crystal driving circuit 350 and one end of each of signal wiring portions 310*b* . . . (lower end in the drawing) are connected via first leader wiring 331 . . .

Reference numerals 340 . . . designates vertical conducting terminals, and the vertical conducting terminals 340 and the terminal provided on the second plate, not shown, are connected by the vertical conducting materials 341. The vertical conducting terminals 340 . . . and the liquid crystal driving circuit 350 are connected by second leader wirings 332 . . .

According to the present embodiment, the signal wiring portions 310*b* . . . provided on the first plate 300, the first leader wirings 331 . . . , the second leader wirings 332 . . . are formed based on the wiring forming process described above respectively. Consequently, a high-quality liquid crystal display device in which unevenness of the electric property is solved can be obtained.

Subsequently, another embodiment of the liquid crystal display device, which is the electro-optic device of the present invention, will be described.

Figure 9:
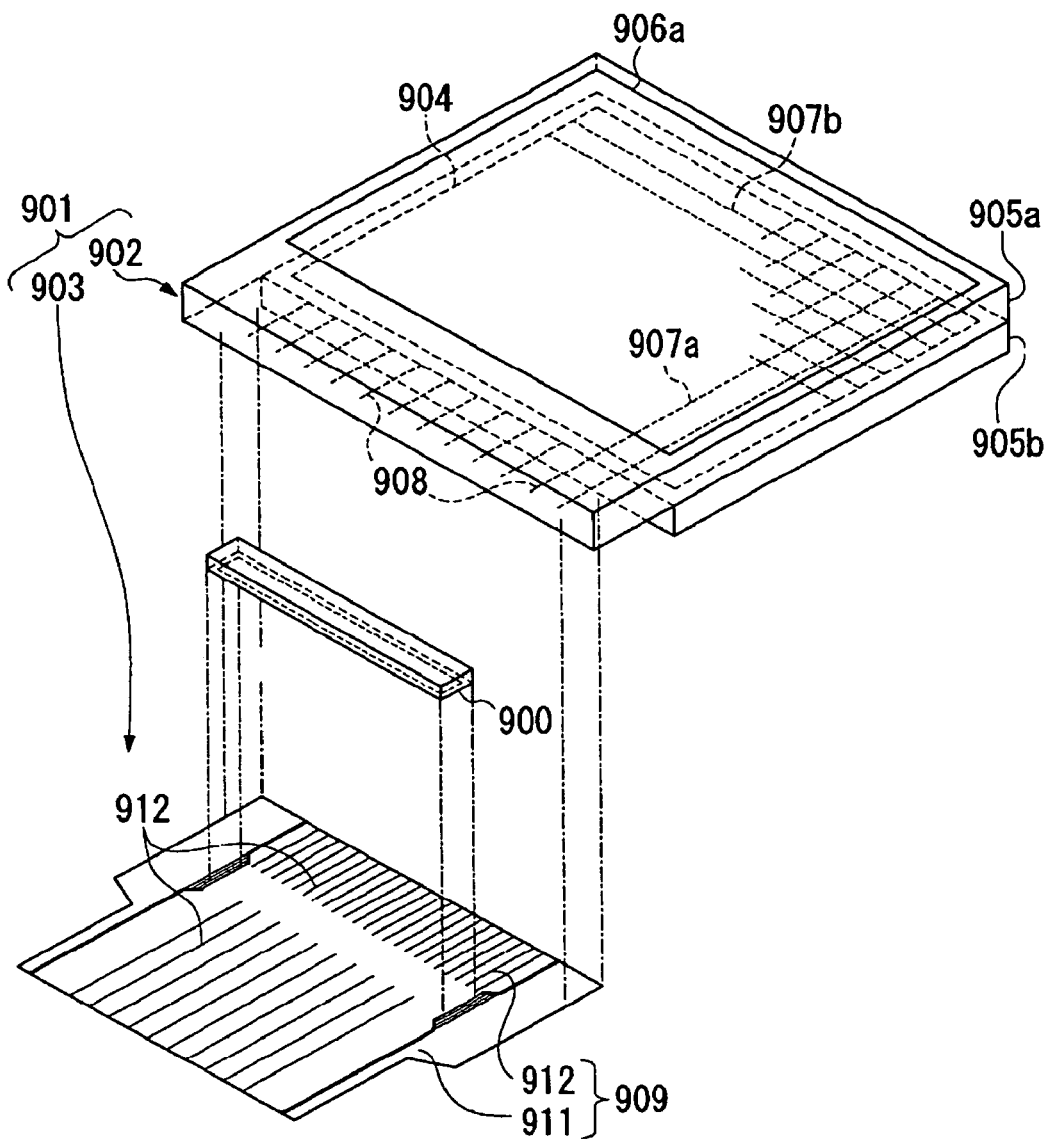
FIG. 9 is a drawing showing another embodiment of the liquid crystal display device.

The liquid crystal display device (electro-optic device) 901 shown in FIG. 9 roughly includes a colored liquid crystal panel (electro-optical panel) 902, and a circuit plate 903 to be connected to the liquid crystal panel 902. When needed, an illumination device such as a back light or the like, or other accessories are provided on the liquid crystal panel 902.

The liquid crystal panel 902 includes a pair of plates 905*a* and 905*b* adhered by a sealing material 904, and liquid crystal is encapsulated in a gap defined between the plate 905*b* and the plate 905*b*, that is, in a cell gap. The plate 905*a* and the plate 905*b* are generally formed of translucent material, such as glass or synthetic resin. A deflecting plate 906*a* and a deflecting plate 906*b* are adhered on the outer surfaces of the plate 905*a* and the plate 905*b*. In FIG. 9, the deflecting plate 906*b* is not shown.

An electrode 907*a* is formed on the inner surface of the plate 905*a*, and an electrode 907*b* is formed on the inner surface of the plate 905*b*. These electrodes 907*a*, 907*b* are formed in stripes, characters, numerals, or other appropriate patterns. The electrodes 907*a*, 907*b* are formed of translucent material, for example, ITO (Indium Tin Oxide). The plate 905*a* includes an overhanging portion overhanging toward the plate 905*b*, and a plurality of terminals 908 are formed on the overhanging portion. These terminals 908 are formed simultaneously with the electrode 907*a* when forming the electrode 907*a* on the plate 905*a*. Therefore, these terminals 908 are formed, for example, of ITO. These terminals 908 include the one extending integrally from the electrode 907*a*, and the one connected to the electrode 907*b* via the conductive material (not shown).

A semiconductor device 900 as a liquid crystal driving IC is mounted at a predetermined position on a wiring plate 909 of the circuit plate 903. Though it is not shown in the drawing, a resistor, a condenser, or other chip components may be mounted at predetermined positions other than the portion to which the semiconductor device 900 is mounted. The wiring plate 909 is fabricated by patterning a metal film such as Cu formed on a base plate 911 having flexibility, such as polyimide, and forming a wiring pattern 912.

According to the present embodiment, the electrodes 907a, 907b in the liquid crystal panel 902 and the wiring pattern 912 in the circuit plate 903 are formed by the method of manufacturing the device described above.

According to the liquid crystal display device of the present embodiment, a high-quality liquid crystal display device in which unevenness of the electric property is solved can be obtained.

While the example shown above is a passive-type liquid crystal panel, an active matrix liquid crystal panel is also applicable. In other words, a thin film transistor (TFT) is formed on one of the plates, and a pixel electrode is formed for each TFT. Wirings for electrically connecting to the respective TFT (gate wiring, source wiring) can be formed by the inkjet technology as described above.

On the other hand, opposing electrodes and the like are formed on the opposed plate. The present invention can be applied also to the active matrix liquid crystal panel as described above.

Figure 10:
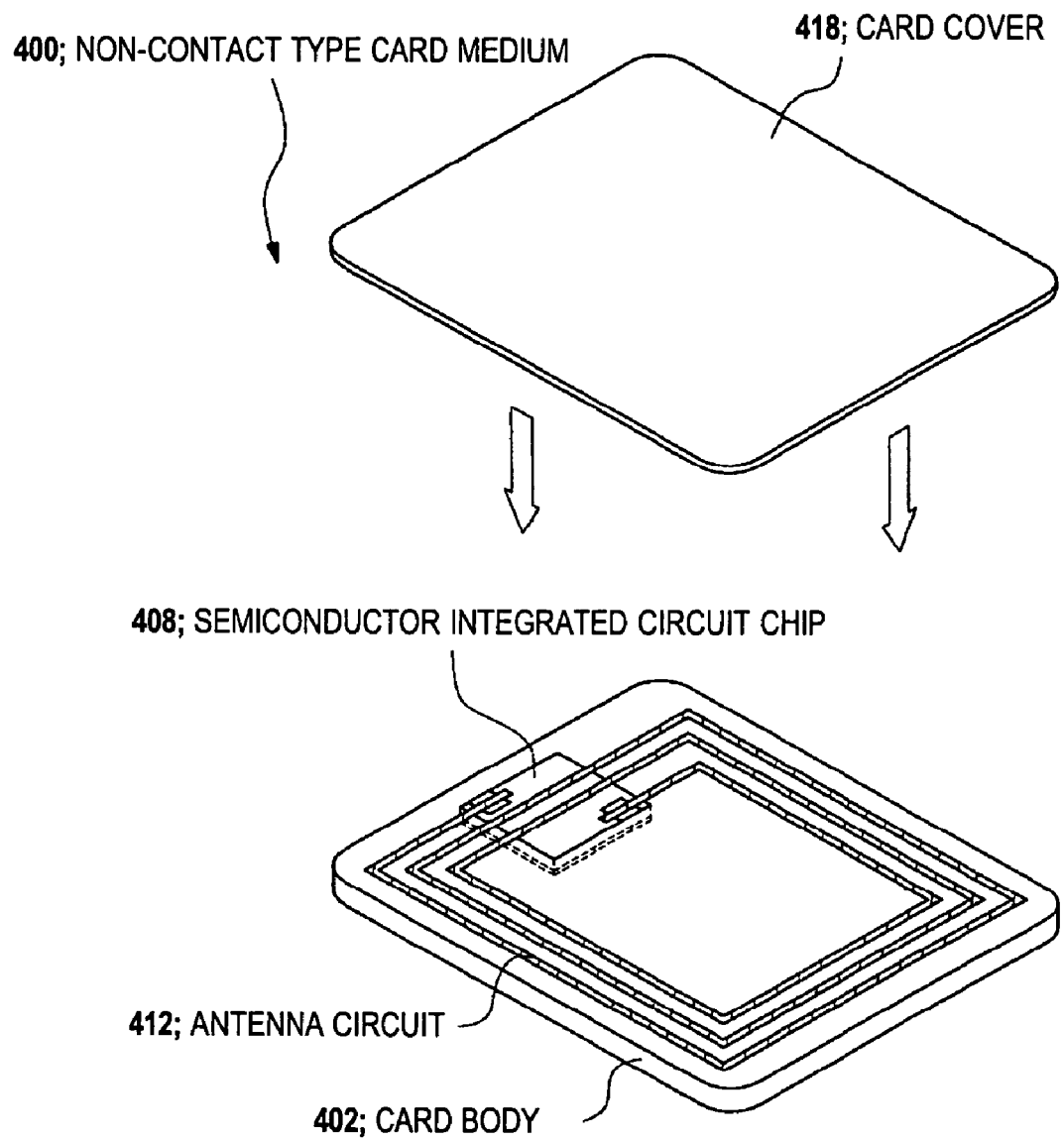
FIG. 10 is an exploded perspective view of a non-contact type card medium.
Figure 11:
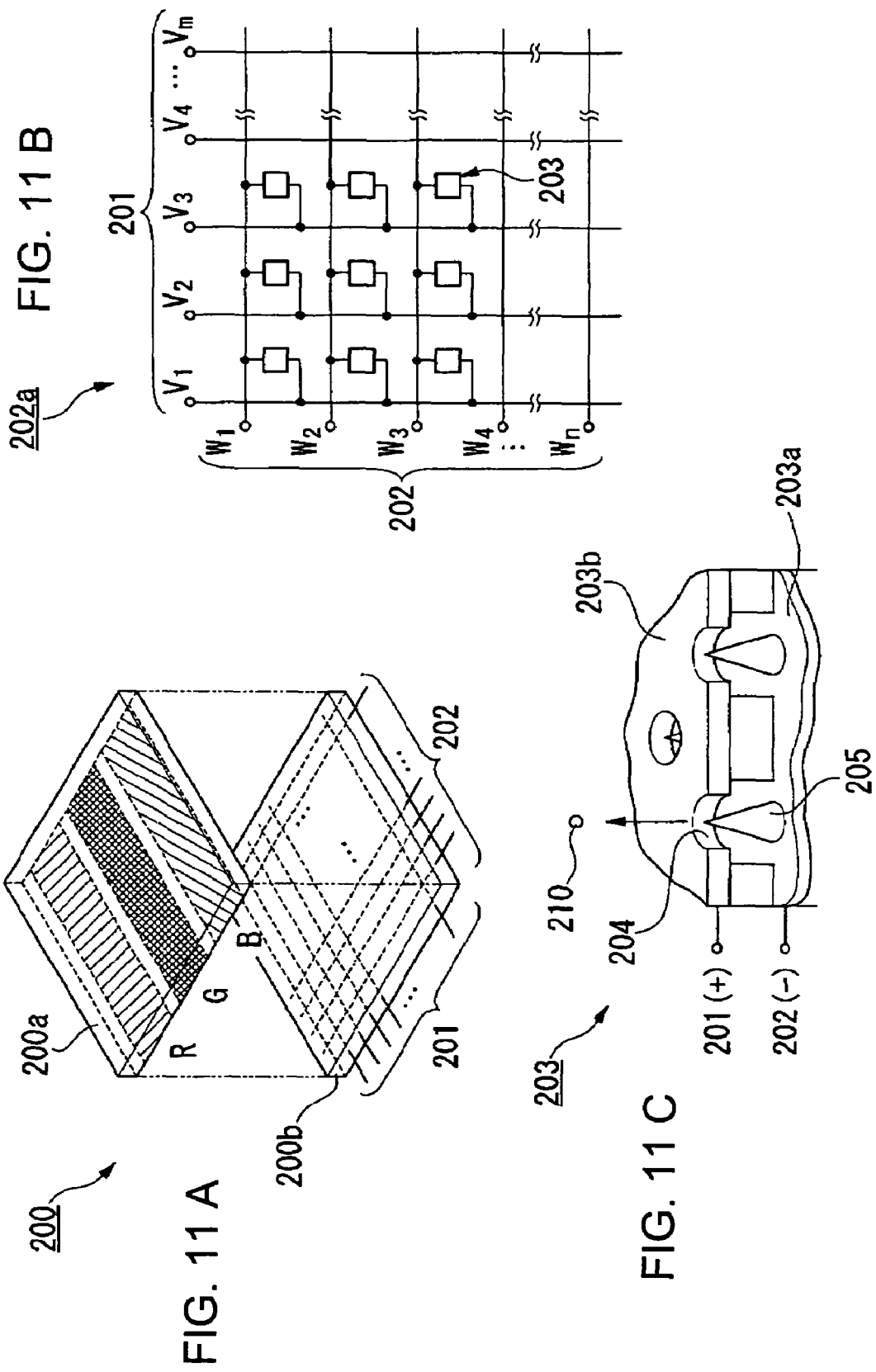
FIGS. 11A-C are explanatory drawings of a field emission display (FED).
Figure 12:
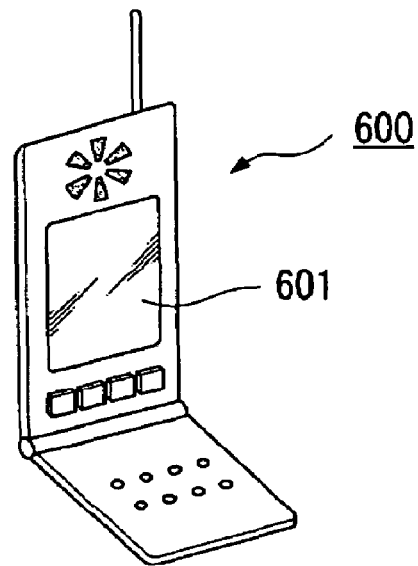
FIGS. 12A-C are drawings showing detailed examples of electronic equipment of the present invention.
Figure 12:
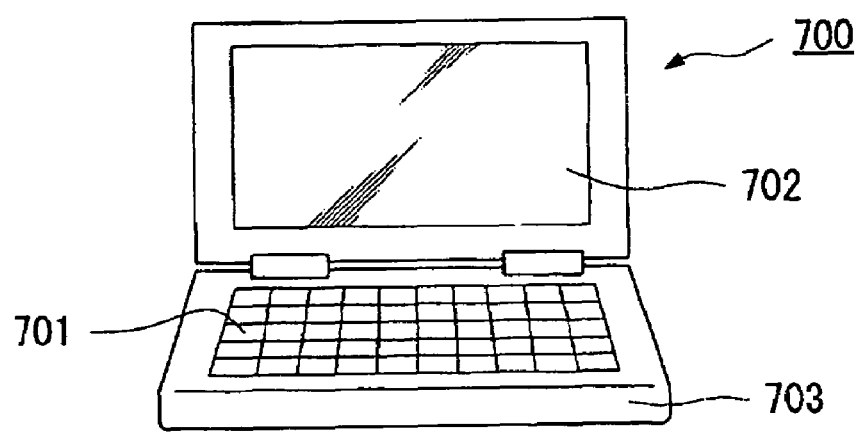
Figure 12:
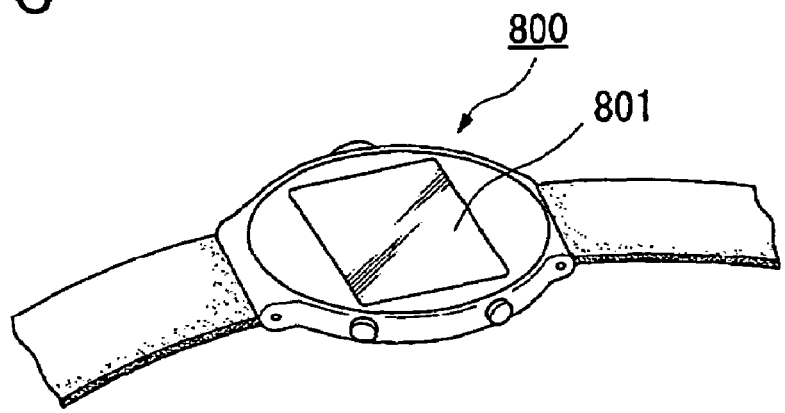

As another embodiment of the electro-optic device, an embodiment of a non-contact type card media of the present invention will be described. As shown in FIG. 10, the non-contact type card media (electro-optic device) 400 of the present embodiment is configured in such a manner that a semiconductor integrated circuit chip 408 and an antenna circuit 412 are integrated in an enclosure including a card body 402 and a card cover 418, and at least one of electric supply and data transfer is performed by at least one of an outside transmitter, not shown, and electromagnetic wave or by electrostatic capacity bonding.

In the present embodiment, the antenna circuit 412 is formed by the method of manufacturing the device described above.

According to the non-contact type card media of the present embodiment, a high-quality non-contact type cart media in which unevenness of the electric property is solved is obtained.

Subsequently, as another embodiment of the electro-optic device, a field emission display (hereinafter, referred to as "FED", which is an electro-optic device provided with a field emission element (electricity emission element) will be described.

FIGS. 11A-C are explanatory drawings showing the FED. FIG. 11(a) is a general block diagram showing the layout of a cathode plate and an anode plate constituting the FED, FIG. 11(b) is a schematic diagram of the driving circuit provided on the cathode of the FED, and FIG. 11(c) is a perspective view showing a principal portion of the cathode plate.

As shown in FIG. 11(a), the FED (electro-optic device) 200 includes a cathode plate 200a and an anode plate 200b disposed so as to oppose to each other. The cathode plate 200a includes, as shown in FIG. 11(b), gate lines 201, emitter lines 202, and field emission element 203 connected to the gate liens 201 and the emitter lines 202. That is, so called simple matrix driving circuit is formed. The gate lines 201 are configured to receive gate signals V1, V2, . . . , Vm, and the emitter lines 202 are configured to receive emitter signals W1, W2, . . . , Wn. The anode plate 200b is provided with fluorescent materials composed of RGB, and the fluorescent material has a property to emit light when subjected to electron.

As shown in FIG. 11(c), the field emission element 203 includes emitter electrodes 203a connected to the emitter lines 202, and gate electrodes 203b connected to the gate lines 201. Furthermore, the emitter electrode 203a is provided with projections called emitter tips 205 tapered from the emitter electrode 203a toward the gate electrode 203b. The gate electrode 203b is formed with holes 204 at the positions corresponding to the emitter tips 205, so that the extremities of the emitter tips 205 are placed in the holes 204.

In the FED 200 constituted as described above, a voltage is supplied between the emitter electrodes 203a and the gate electrodes 203b by controlling the gate signals V1, V2, . . . , Vm of the gate liens 201, and the emitter signals W1, W2, . . . , Wn of the emitter lines 202, then electrons 210 move from the emitter tips 205 into the holes 204 by the action of electrolyzation, and the electrons 210 are emitted from the extremities of the emitter tips 205. At this time, light is emitted when the electrons 210 and the fluorescent material of the anode plate 200b come into contact, desired driving of the FED 200 is achieved.

In the FED thus configured, for example, the emitter electrodes 203a, the emitter lines 202, and in addition, the gate electrodes 203b or the gate lines 201 are formed by the method of manufacturing the device described above.

According to the FED of the present embodiment, a high-quality FED in which unevenness of the electric property is solved can be obtained.

The devices to which the present invention can be applied are not limited to the electro-optic devices, and may be applied to the manufacture of other devices such as a circuit board on which the conductive film wiring is formed, or the wiring mounted on the semiconductor.

Subsequently, detailed examples of electronic equipment of the present invention will be described.

FIG. 12(a) is a perspective view showing an example of a mobile telephone. In FIG. 12(a), reference numeral 600 designates a mobile telephone body, and reference numeral 601 designates a liquid crystal display unit provided with the liquid crystal display device according to the embodiments described above.

FIG. 12(b) is a perspective view showing an example of a portable information processing device, such as a word processor, or a personal computer. In FIG. 12(b), reference numeral 700 designates an information processing device, reference numeral 701 designates an input device such as a keyboard, reference numeral 703 designates an information processing body, and reference numeral 702 designates a liquid crystal display unit provided with the liquid crystal device of the embodiments described above.

FIG. 12(c) is a perspective view showing an example of watch type electronic equipment. In FIG. 12(c), reference numeral 800 designates a watch body, and reference numeral 801 designates a liquid crystal display unit provided with a liquid crystal display device of the embodiments described above.

The electronic equipment shown in FIGS. 12(a)-(c) are provided with the liquid crystal display device of the embodiments described above, defects such as disconnection or short circuit of the wirings hardly occur, and downsizing and reduction in thickness is possible.

While electronic equipment of the present embodiment is provided with the liquid crystal display device, electronic equipment provided with other electro-optic devices such as an organic electroluminescence display device, the plasma-type display device, and the FED is also applicable.

While the preferred embodiments of the present invention have been described thus far referring to the attached drawings, it is to be understood that the present invention is not limited to those embodiments. The shape or combination of the respective components shown in the embodiments described above are simply shown as an example, and various modifications may be made based on design requirements without departing the scope of the invention.

For example, while the second conductive film formed in the above-described embodiments is described to be the dummy pattern, it is not limited thereto, and may be used as a connecting wiring different from the electrode pattern by providing a connecting terminal at the end thereof. The conductive film and the second conductive film do not necessarily have to be formed of the same material, and may be formed of different types of material.

What is claimed is:

1. A device comprising:
   a plate;
   a single molecular layer of fluoroalkyl silane on the plate;
   a liquid drop discharged first conductive film wiring disposed in a wiring pattern area on the single molecular layer wherein the liquid drop discharged first conductive film contains metallic fine particles; and
   a dummy wiring film formed on the single molecular layer outside the wiring pattern area on the single molecular layer, the dummy wiring film electrically separated from the first conductive film.

2. A device according to claim 1, wherein the first conductive film and the dummy wiring film are formed of the same material.

3. A device according to claim 1, wherein an end of the dummy wiring comprises a connecting terminal.

4. An electro-optic device comprising the device according to claim 1.

5. Electronic equipment comprising the electro-optic device according to claim 4.

* * * * *